(12) United States Patent
Wu et al.

(10) Patent No.: US 7,716,562 B1
(45) Date of Patent: May 11, 2010

(54) REDUCED PROCESSING IN HIGH-SPEED REED-SOLOMON DECODING

(75) Inventors: Yingquan Wu, Santa Clara, CA (US); Meng-Kun Lee, Cupertino, CA (US); Kwok Alfred Yeung, Milpitas, CA (US)

(73) Assignee: Link_A_Media Devices Corporation, Santa Clara, CA (US)

( * ) Notice: Subject to any disclaimer, the term of this patent is extended or adjusted under 35 U.S.C. 154(b) by 713 days.

(21) Appl. No.: 11/254,068

(22) Filed: Oct. 18, 2005

(51) Int. Cl.
*H03M 13/00* (2006.01)

(52) U.S. Cl. .................................. 714/784; 714/785
(58) Field of Classification Search .............. 714/752, 714/781, 784, 785
See application file for complete search history.

(56) References Cited

U.S. PATENT DOCUMENTS

| | | | | |
|---|---|---|---|---|
| 5,099,482 A | * | 3/1992 | Cameron | 714/784 |
| 6,209,115 B1 | * | 3/2001 | Truong et al. | 714/784 |
| 6,374,383 B1 | * | 4/2002 | Weng | 714/781 |
| 6,643,819 B1 | * | 11/2003 | Weng | 714/785 |
| 6,684,364 B2 | * | 1/2004 | Cameron | 714/785 |
| 6,888,897 B1 | | 5/2005 | Nazari et al. | |
| 6,917,313 B1 | | 7/2005 | Burd et al. | |
| 6,931,585 B1 | | 8/2005 | Burd et al. | |
| 6,961,197 B1 | | 11/2005 | Burd et al. | |
| 7,028,245 B2 | * | 4/2006 | Zhang | 714/784 |
| 7,051,267 B1 | | 5/2006 | Yu et al. | |
| 7,080,310 B2 | * | 7/2006 | Cameron | 714/785 |

OTHER PUBLICATIONS

E. R Berlekamp, *Algebraic Coding Theory*, New York: McGraw-Hill, 1968. pp. 218-223 & 178-189. (revised ed.—Laguna Hills, CA Aegean Park, 1984.).

R. E. Blahut, *Algebraic Codes for Data Transmission*, Cambridge: Cambridge University Press, 2003. pp. 192-201.

H. O. Burton, "Inversionless Decoding of Binary BCH codes," *IEEE Trans. Inform. Theory*, vol. 17, pp. 464-466, Jul. 1971.

I. S. Reed, M. T. Shih, and T. K. Truong, "VLSI Design of Inverse-free Berlekamp-Massey algorithm," *Proc. Inst. Elect. Eng.*, pt. E, vol. 138, pp. 295-298, Sep. 1991.

D. V. Sarwate and N. R. Shanbhag, "High-speed Architectures for Reed-Solomon Decoders," *IEEE Trans. VLSI Systems*, vol. 9, pp. 641-655, Oct. 2001.

E. R. Berlekamp, G. Seroussi, and P. Tong, "A hypersystolic Reed-Solomon Decoder," *Reed-Solomon Codes and Their Applications*, S. B. Wicker and V. K. Bhargava, Eds. Piscataway, NJ: IEEE Press, 1994.

H.-C. Chang and C. B. Shung, "New Serial Architecture for the Berlekamp-Massey Algorithm," *IEEE Trans. Comm.*, vol. 47, pp. 481-483, Apr. 1999.

H. M. Shao, T. K. Truong, L. J. Deutsch, J. H. Yuen, and I. S. Reed, "A VLSI Design of a Pipeline Reed-Solomon Decoder," *IEEE International Conference on ICASSP '85*, vol. 10, pp. 1404-1407, May 1985.

H. Lee, "High-Speed VLSI Architecture for Parallel Reed-Solomon Decoder," *IEEE Trans. VLSI Systems*, vol. 11, pp. 288-294, Apr. 2003.

* cited by examiner

*Primary Examiner*—Esaw T Abraham
(74) *Attorney, Agent, or Firm*—Van Pelt, Yi & James LLP

(57) ABSTRACT

Processing polynomials is disclosed. At least a portion of processing associated with an error evaluator polynomial and at least a portion of processing associated with an error locator polynomial are performed simultaneously. The error evaluator polynomial and the error locator polynomial are associated with Berlekamp-Massey processing. Data associated with the error evaluator polynomial is progressively removed.

20 Claims, 10 Drawing Sheets

| Architecture | Adders | Multipliers | Latches | Muxes | Clock Cycles | $T_{crit-path}$ |
|---|---|---|---|---|---|---|
| rIBMM | $2t$ | $3t + 2$ | $2t + 2$ | $t + 1$ | $2t$ | $2T_{mult} + \lceil \log_2(2t+2) \rceil T_{add}$ |
| rPIBMM | $2t + 1$ | $4t + 2$ | $4t + 2$ | $6t + 3$ | $2t$ | $T_{mult} + T_{add}$ |
| IBMM | $3t + 1$ | $5t + 3$ | $6t + 2$ | $2t + 1$ | $2t$ | $2T_{mult} + \lceil \log_2(2t+2) \rceil T_{add}$ |
| PIBMM | $3t + 1$ | $6t + 2$ | $6t + 2$ | $3t + 1$ | $2t$ | $T_{mult} + T_{add}$ |
| EEM | $4t + 2$ | $8t + 8$ | $4t + 4$ | $8t + 8$ | $2t$ | $T_{mult} + T_{add} + T_{mux}$ |

FIG. 7

REDUCED PROCESSING IN HIGH-SPEED REED-SOLOMON DECODING

BACKGROUND OF THE INVENTION

Reed-Solomon codes are used in a variety of applications including optical and magnetic storage devices, satellite communications, and compact disk recording. In some of these applications, Reed-Solomon codes are implemented as a hardware device, such as an Application Specific Integrated Circuit (ASIC) or a Field Programmable Gate Array (FPGA). The decoder is typically much larger and more computation intensive than the encoder. In hardware and non-hardware implementations, improved Reed-Solomon decoders (for example, with reduced hardware or reduced latency) may be useful to systems that employ such devices.

BRIEF DESCRIPTION OF THE DRAWINGS

Various embodiments of the invention are disclosed in the following detailed description and the accompanying drawings.

FIG. 7 is a table illustrating implementation costs and critical path delays of some embodiments of methods used in Reed Solomon decoding.

DETAILED DESCRIPTION

Figure 1:
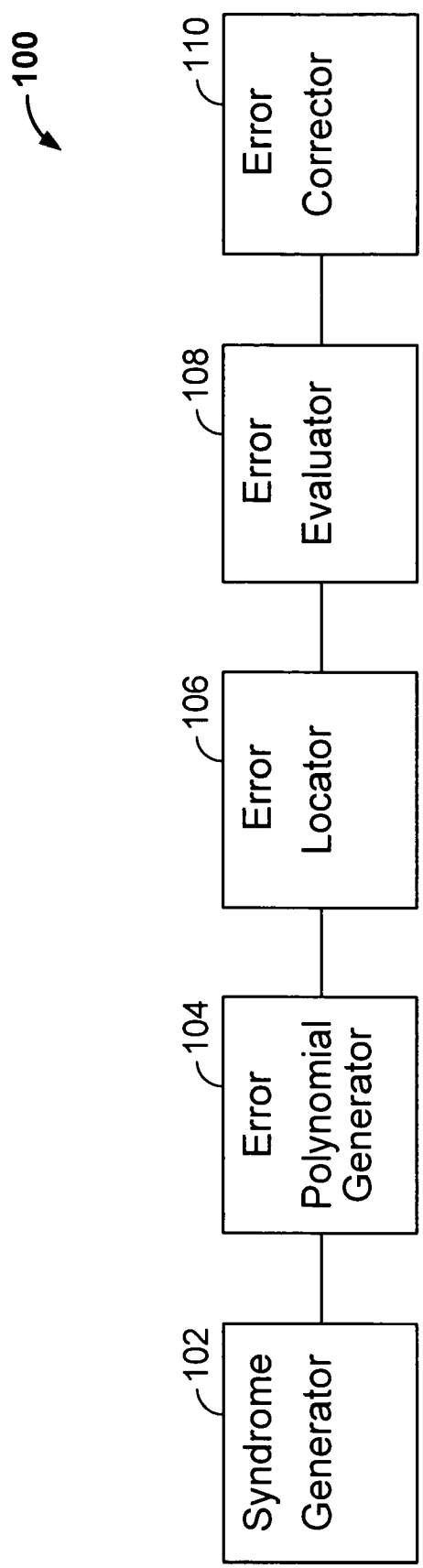
FIG. 1 is a diagram illustrating an embodiment of a Reed-Solomon decoder.

The invention can be implemented in numerous ways, including as a process, an apparatus, a system, a composition of matter, a computer readable medium such as a computer readable storage medium or a computer network wherein program instructions are sent over optical or electronic communication links. In this specification, these implementations, or any other form that the invention may take, may be referred to as techniques. A component such as a processor or a memory described as being configured to perform a task includes both a general component that is temporarily configured to perform the task at a given time or a specific component that is manufactured to perform the task. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Various embodiments of scalable Very large scale integration (VLSI) architectures for Reed-Solomon decoders with the Berlekamp-Massey method are disclosed. The illustrated decoders may use an inversionless Berlekamp-Massey method using the Horiguchi-Koetter formula for error evaluation. The described error evaluation may eliminate computation of an error evaluator polynomial so that t cycles are eliminated, where t is the error correction capability of the code. Using a dynamic stopping rule, t registers and shift operators in the Berlekamp-Massey method and t registers and multipliers in the error evaluation are eliminated in some embodiments. A parallel inversionless Berlekamp-Massey method that may use less hardware than some other methods is also disclosed. Parallel methods and devices may be preferred in applications where latency is a concern. In some embodiments, 4t+2 multipliers and registers are used in a system of the parallel method, compared to 6t+2 multipliers and registers used in a system that implements another type of a parallel inversionless Berlekamp-Massey method, and 8t+8 multipliers and 4t+4 registers used by a system of an extended Euclidean method. In some embodiments, devices of the described architecture are power efficient because of reduced hardware and reduced processing time.

Reed-Solomon codes are used in a variety of applications. Storage devices use Reed-Solomon decoders to correct data read from the storage medium. Storage devices may be read-only or read-write and include magnetic storage, barcodes, and DVD. Wireless communication devices use Reed-Solomon decoders in their receivers to correct for errors over the wireless channel. Similarly, wired transceivers such as high speed modems and digital televisions use Reed-Solomon codes to correct for errors introduced during transmission over the communication channel. Other applications besides those described above may use a Reed-Solomon decoder as described herein.

FIG. 1 is a diagram illustrating an embodiment of a Reed-Solomon decoder. In the example shown, for a Reed-Solomon $C(n,k)$ code over a Galois Field of $GF(p^m)$, a k-symbol data word $D \triangleq [D_{k-1}, D_{k-2}, \ldots, D_1, D_0]$ is encoded to produce an n-symbol codeword $C \triangleq [C_{n-1}, C_{n-2}, \ldots, C_1, C_0]$. Another way of expressing this is that a data word polynomial $D(x) = D_{k-1}x^{k-1} + D_{k-2}x^{k-2} + \ldots + D_1x^1 + D_0$ is encoded to produce a codeword polynomial $C(x) = C_{n-1}x^{n-1} + C_{n-2}x^{n-2} + \ldots + C_1x + C_0$, by means of a generator polynomial $$G(x) \triangleq \prod_{i=0}^{n-k-1} (x - \alpha^{m_0+i}),$$

where $m_0$ is typically 0 or 1 and $\alpha$ is a primitive element of $GF(p^m)$. As used herein, vector $A = [A_0, A_1, A_2, \ldots, A_l]$ and its polynomial representation $A(x) = A_0 + A_1x + A_2x^2 + \ldots A_lx^l$ may be used interchangeably. In some embodiments, a polynomial of degree less than n is a codeword polynomial if and only if it is a multiple of the generator polynomial, G(x). A codeword polynomial C(x) satisfies $$C(\alpha^{m_0+i})=0, i=0,1,2,\ldots,n-k-1.$$

The minimum Hamming distance of the code is $d_{min}=n-k-1$, a feature known as maximally-distance-separable. Examples described herein consider the specific case where $p=2$ (i.e., $GF(2^m)$), instead of the general case where $GF(p^m)$, and $m_0=1$. In other words, the code illustrated in this embodiment is defined such that $n-k=2t$ (where t is the error-correction capability). Although examples described herein consider the above specific case, in some embodiments, other cases may be used.

A systematic encoding generates a codeword that is comprised of the data word and parity-check symbols. To generate a codeword, let $\Psi(x) \triangleq \Psi_{2t-1} x^{2t-1} + \Psi_{2t-2} x^{2t-2} + \ldots + \Psi_1 x + \Psi_0$ denote the remainder when $x^{2t} D(x)$ is divided by $G(x)$. The polynomial $x^{2t} D(x) - \Psi(x)$ is then a multiple of $G(x)$ and is denoted as a systematic codeword polynomial; alternatively, $C = [D_{k-1}, D_{k-2}, \ldots, D_0, -\Psi_{2t-1}, -\Psi_{2t-2}, \ldots, -\Psi_0]$.

Let $C(x)$ denote the transmitted codeword polynomial and $R(x)$ the received word polynomial after appropriate channel quantization. The received word polynomial, $R(x)$, is passed to decoder 100 and may include some errors. The decoding objective is to determine the error polynomial $E(x)$ such that $C(x)=R(x)-E(x)$. That is, decoder 100 attempts to produce the original codeword, $C(x)$, using the received polynomial, $R(x)$.

Syndrome generator 102 generates syndrome values using the received polynomial, $R(x)$. Syndrome values are computed using:

$$S_i = R(\alpha^{i+1}) = C(\alpha^{i+1}) + E(\alpha^{i+1}) = E(\alpha^{i+1}), i=0,1,2,\ldots,2t-1.$$

If all 2t syndrome values are zero, then $R(x)$ is a codeword and it may be assumed that $C(x)=R(x)$, i.e., no errors have occurred. Otherwise, the decoder attempts to solve the following equation system:

$$\begin{cases} Y_1 X_1^1 + Y_2 X_2^1 + \ldots + Y_e X_e^1 = S_0 \\ Y_1 X_1^2 + Y_2 X_2^2 + \ldots + Y_e X_e^2 = S_1 \\ \vdots \\ Y_1 X_1^{2t} + Y_2 X_2^{2t} + \ldots + Y_e X_e^{2t} = S_{2t-1} \end{cases}$$

where e denotes the (unknown) number of errors, $X_1, X_2, \ldots, X_e$ denote the error locations, and $Y_1, Y_2, \ldots, Y_e$ denote the corresponding error magnitudes.

The syndrome polynomial generated by syndrome generator 102 is defined to be:

$$S(x) \triangleq S_0 + S_1 x + S_2 x^2 + \ldots + S_{2t-1} x^{2t-1}. \quad (1)$$

The syndromes (i.e., the coefficients of the syndrome polynomial) are passed from syndrome generator 102 to error polynomial generator 104. Error polynomial generator 104 generates the error locator polynomial, $\Lambda(x)$, which is defined to be:

$$\Lambda(x) \triangleq \prod_{i=1}^{e} (1 - X_i x) = 1 + \Lambda_1 x + \Lambda_2 x^2 + \ldots + \Lambda_e x^e. \quad (2)$$

The error evaluator polynomial is defined to be:

$$\Omega(x) \triangleq \sum_{i=1}^{e} Y_i X_i \prod_{j=1, j \neq i}^{e} (1 - X_j x) = \Omega_0 + \Omega_1 x + \Omega_2 x^2 + \ldots + \Omega_{e-1} x^{e-1}. \quad (3)$$

The three polynomials satisfy the following key equation:

$$\Omega(x) = \Lambda(x) S(x) \pmod{x^{2t}}. \quad (4)$$

Both the Berlekamp-Massey method and the extended Euclidean method can be used to solve the above key equation, given that the number of errors e does not exceed the error-correction capability t. In particular, both the Berlekamp-Massey method and the extended Euclidean method may be used in error polynomial generator 104 to generate the error locator polynomial $\Lambda(x)$. Additional polynomials besides the error locator polynomial may be generated by error polynomial generator 104.

Embodiments illustrated herein consider parallel and non-parallel inversionless Berlekamp-Massey methods. Although the embodiments and examples illustrated describe particular decoder scenarios, the methods and techniques illustrated may be applied to other cases.

Example pseudo code for an Inversionless Berlekamp-Massey Method (IBMM) follows.
Input: $S=[S_0, S_1, S_2, \ldots, S_{2t-1}]$
Initialization: $\Lambda^{(0)}(x)=1$, $B^{(0)}(x)=1$, $\gamma^{(0)}=1$, $L=0$
For $r=0, 1, 2, \ldots, 2t-1$, do:

$$-\text{Compute } \Delta^{(r)} = \sum_{i=0}^{L} \Lambda_i^{(r)} \cdot S_{r-i}$$

Compute $\Lambda^{(r+1)}(x) = \gamma^{(r)} \cdot \Lambda^{(r)}(x) - \Delta^{(r)} \cdot x B^{(r)}(x)$
If $\Delta^{(r)} \neq 0$ and $2L \leq r$, then
  Set $B^{(r+1)}(x) \leftarrow \Lambda^{(r)}(x)$ and $L \leftarrow r+1-L$
  Set $\gamma^{(r+1)} \leftarrow \Delta^{(r)}$
Else
  Set $B^{(r+1)}(x) \leftarrow x B^{(r)}(x)$
  Set $\gamma^{(r+1)} \leftarrow \gamma^{(r)}$
endif
endfor
Output: $\Lambda = [\Lambda_0^{(2t)}, \Lambda_1^{(2t)}, \Lambda_2^{(2t)}, \ldots, \Lambda_t^{(2t)}]$, $\gamma = \gamma^{(2t)}$, L
$B = [B_0^{(2t)}, B_1^{(2t)}, B_2^{(2t)}, \ldots, B_{2t-1}^{(2t)}]$
where superscript $^{(r)}$ indicates the r-th iteration and subscript $_i$ indicates the i-th coefficient.

The error locator polynomial, $\Lambda(x)$, is passed from error polynomial generator 104 to error locator 106. Error locations may correspond to the roots, $X_i$, of the error locator polynomial, $\Lambda(x)$. Error locator 106 may use a Chien search method to determine error locations.

Error evaluator 108 determines the error magnitudes, $Y_i$. Error locations are received from error locator 106 and are used to determine the error magnitudes. Some Reed Solomon decoders use the Forney formula to determine the error magnitudes. Other error magnitude formulas besides the Forney formula may be determined and used to generate the error magnitudes. For example, error magnitudes formulas that allow reduced hardware or reduced clock cycles may be preferred. In some embodiments, the error magnitude formula may allow improvements in other blocks besides the error evaluator. For example, using some error magnitude formulas, error polynomial generator 104 or error locator 106 may also be improved.

Error corrector 110 uses the error magnitudes and error locations to correct the received polynomial, R(x). If the error correction capability of the code is able to correct for the received errors, E(x), then the output of error corrector 110 is C(x), the codeword originally transmitted.

Some properties of the Berlekamp-Massey method are characterized in the following lemmas.

Lemma 1

The degrees of $B^{(r)}(x)$ and $\Lambda^{(r)}(x)$ obtained during the Berlekamp-Massey iterations satisfy:

$$\deg(B^{(r)}) + \deg(\Lambda^{(r)}) = r, \; 0 \leq r \leq 2t. \tag{5}$$

The proof may be shown by induction.

Lemma 2

(i). The degree of B(x) may be as high as 2t−1.

(ii). Ignoring zeros, the degree of B(x) is at most t−1.

(iii). If at the r-th (r<2t) iteration $B^{(r)}(x)$ has degree t−1, then, either more than t errors have occurred (i.e., uncorrectable), or $\Lambda^{(r+1)}(x)$ contains all error locations.

Proof of (i): In the worst case scenario there is one symbol error, accordingly the degree of Λ(x) is 1. Lemma 1 implies that the degree of B(x) is 2t−1.

Proof of (ii): When L=deg(Λ)>t, according to Lemma 1, deg(B)=2t−deg(Λ)≤t−1; when L=deg(Λ)≤t, the Berlekamp-Massey iteration indicates that B(x) is right-shifted polynomial of a preceding $\Lambda^{(2t)}(x) = \Lambda(x)$ that has a smaller degree than Λ(x), then deg(B)<deg(Λ)≤t.

Proof of (iii): If at most t errors have occurred, then all error locations are the all roots of $\Lambda^{(2t)}(x)$, which implies that the degree of $\Lambda^{(2t)}(x)$ is at most t. If r=2t−1, then the conclusion holds. Next, consider the case of r<2t−1. Let $L^{(r)}$ be the degree of $\Lambda^{(r)}(x)$. Let r'>r the be smallest number such that at $\Delta^{(r')} \neq 0$, then $$r' - 2L^{(r)} = r' - 2r + 2(r - L^{(r)}) = r' - 2r + 2(t-1) < 0,$$

where $r - L^{(r)}$ represents the degree of $B^{(r)}(x)$. $L^{(r'+1)}$ is updated by $$r'+1-L^{(r')} = r'+1-r+(r-L^{(r)}) \leq r'+1-r+(t-1) > t.$$

This conflicts with the conclusion that $\deg(\Lambda^{(r'+1)}) \leq \deg(\Lambda^{(2t)}) \leq t$. Thus, all subsequent discrepancies $\Delta^{(r'+1)}$, $\Delta^{(r'+2)}, \ldots, \Delta^{(2t-1)}$ are all zeros, and therefore $\Lambda^{(r+1)}(x)$ differs from $\Lambda^{(2t)}(x)$ by a scalar factor. Lemma 2 is therefore proven.

Once given the error locator polynomial Λ(x), its roots (which indicate the error locations), may be obtained through a Chien search. The corresponding error magnitudes may be obtained from the Forney formula:

$$Y_i = \frac{\Omega(X_i^{-1})}{X_i^{-1}\Lambda'(X_i^{-1})}, \; i = 1, 2, \ldots, e. \tag{6}$$

However, this approach performs the computation of Ω(x)= Λ(x)S(x) (mod $x^{2t}$), which takes t additional cycles after the Chien search has found the error locations and may not be desirable compared to methods that do not use Ω(x). Lemma 3 defines a new error evaluation approach that avoids the computation of Ω(x).

Lemma 3

(i) Given the inversionless Berlekamp-Massey iteration in the form $$\begin{bmatrix} \Lambda^{(r+1)}(x) \\ B^{(r+1)}(x) \end{bmatrix} = \begin{bmatrix} \gamma^{(r)} & -\Delta^{(r)}x \\ \delta & (1-\delta)x \end{bmatrix} \begin{bmatrix} \Lambda^{(r)}(x) \\ B^{(r)}(x) \end{bmatrix} \tag{7}$$

with the initial conditions $$\Lambda^{(0)}(x)=1, B^{(0)}(x)=1, \gamma^{(0)}=1$$

where $\delta \in \{0,1\}$ is dependent of each iteration and $$\gamma^{(r+1)} = \gamma^{(r)}(1-\delta) + \Delta^{(r)}\delta, \tag{8}$$

then $$\Omega^{(r)}(x)B^{(r)}(x) - \Lambda^{(r)}(x)\theta^{(r)}(x) = \gamma^{(r)}\Lambda_0^{(r)}x^r \tag{9}$$

where $$\Omega^{(r)}(x) \triangleq \Lambda^{(r)}(x)S(x) \bmod x^r, \; \theta^{(r)}(x) \triangleq B^{(r)}(x)xS(x) - x^r \bmod x^{r+1}$$

(by definition $\Omega^{(0)}(x)=0$ and $\theta^{(0)}(x)=-1$).

(ii) The error magnitude of a given error location is given by $$Y_i = \frac{\gamma \Lambda_0 X_i^{-(2t-1)}}{B(X_i^{-1})\Lambda'(X_i^{-1})}, \; i = 1, 2, \ldots, e. \tag{10}$$

Proof of (i): By induction:

$$\begin{bmatrix} \Omega^{(r+1)}(x) \\ \theta^{(r+1)}(x) \end{bmatrix} = \begin{bmatrix} \gamma^{(r)} & -\Delta^{(r)}x \\ \delta & (1-\delta)x \end{bmatrix} \begin{bmatrix} \Omega^{(r)}(x) \\ \theta^{(r)}(x) \end{bmatrix}.$$

When r=1, $\Lambda^{(1)}(x)=1-S_0 x$, $B^{(1)}(x)=\delta+(1-\delta)x$ which is 1 when $\Delta^{(0)}=S_0$ is zero, or x otherwise. The above equality with respect to $\Omega^{(1)}(x)$ and $\theta^{(1)}(x)$ is verified in the following $$\Omega^{(1)}(x) = \Lambda^{(1)}(x) \cdot xS(x) \bmod x^2$$
$$= S_0 x$$
$$= \gamma^{(0)} \cdot \Omega^{(0)}(x) - \Delta^{(0)} \cdot x\theta^{(0)}(x).$$

$$\theta^{(1)}(x) = B^{(1)}(x) \cdot xS(x) - x \bmod x^2$$
$$= \begin{cases} 0 & \text{if } S_0 \neq 0 \\ -x & \text{if } S_0 = 0 \end{cases}$$
$$= \delta \cdot \Omega^{(0)}(x) + (1-\delta) \cdot x\theta^{(0)}(x) \bmod x^2.$$

Suppose that it is true for r up to K, then, we have for r=K+1, $$\begin{bmatrix} \Omega^{(K+1)}(x) \\ \theta^{(K+1)}(x) \end{bmatrix} = \begin{bmatrix} \Lambda^{(K+1)}(x)xS(x) \\ B^{(K+1)}(x)xS(x) - x^{K+1} \end{bmatrix} (\bmod x^{K+2})$$

$$= \begin{bmatrix} \gamma^{(K)} & -\Delta^{(K)}x \\ \delta & (1-\delta)x \end{bmatrix} \cdot \begin{bmatrix} \Lambda^{(K)}(x)xS(x) \\ B^{(K)}(x)xS(x) \end{bmatrix} - \begin{bmatrix} 0 \\ x^{K+1} \end{bmatrix} (\bmod x^{K+2})$$

$$= \begin{bmatrix} \gamma^{(K)} & -\Delta^{(K)} \\ \delta & (1-\delta) \end{bmatrix} \cdot \begin{bmatrix} \Lambda^{(K)}(x)xS(x) \\ B^{(K)}(x)x^2 S(x) \end{bmatrix} - \begin{bmatrix} 0 \\ x^{K+1} \end{bmatrix} (\bmod x^{K+2})$$

-continued $$= \begin{bmatrix} \gamma^{(K)} & -\Delta^{(K)} \\ \delta & (1-\delta) \end{bmatrix} \cdot \begin{bmatrix} \Omega^{(K)}(x) + \Delta^{(K)} x^{K+1} \\ x(\theta^{(K)}(x) + x^K) \end{bmatrix} - \begin{bmatrix} 0 \\ x^{K+1} \end{bmatrix}$$

$$= \begin{bmatrix} \gamma^{(K)} & -\Delta^{(K)} x \\ \delta & (1-\delta)x \end{bmatrix} \cdot \begin{bmatrix} \Omega^{(K)}(x) \\ \theta^{(K)}(x) \end{bmatrix}.$$

Thus, the following single iteration rule is obtained:

$$\begin{bmatrix} \Omega^{(r+1)}(x) & \Lambda^{(r+1)}(x) \\ \theta^{(r+1)}(x) & B^{(r+1)}(x) \end{bmatrix} = \begin{bmatrix} \gamma^{(K)} & -\Delta^{(K)} x \\ \delta & (1-\delta)x \end{bmatrix} \cdot \begin{bmatrix} \Omega^{(r)}(x) & \Lambda^{(r)}(x) \\ \theta^{(r)}(x) & B^{(r)}(x) \end{bmatrix}.$$

Equation (9) may be shown by induction. When r=1, $$\Omega^{(1)}(x)B^{(1)}(x) - \Lambda^{(1)}(x)\theta^{(1)}(x) = \begin{vmatrix} \Omega^{(1)}(x) & \Lambda^{(1)}(x) \\ \theta^{(1)}(x) & B^{(1)}(x) \end{vmatrix}$$

$$= \begin{vmatrix} \gamma^{(0)} & -\Delta^{(0)} x \\ \delta & (1-\delta)x \end{vmatrix} \cdot \begin{vmatrix} \Omega^{(0)}(x) & \Lambda^{(0)}(x) \\ \theta^{(0)}(x) & B^{(0)}(x) \end{vmatrix}$$

$$= [\gamma^{(0)}(1-\delta) + \Delta^{(0)}\delta] \cdot x$$

$$= \gamma^{(1)} \Lambda_0^{(1)} x,$$

where the last equality is due to Equation (8) and $\Lambda_0^{(1)}=1$. Suppose it is true for r=K, then for r=K+1:

$$\Omega^{(K+1)}(x)B^{(K+1)}(x) - \Lambda^{(K+1)}(x)\theta^{(K+1)}(x) = \begin{vmatrix} \Omega^{(K+1)}(x) & \Lambda^{(K+1)}(x) \\ \theta^{(K+1)}(x) & B^{(K+1)}(x) \end{vmatrix}$$

$$= \begin{vmatrix} \gamma^{(K)} & -\Delta^{(K)} x \\ \delta & (1-\delta)x \end{vmatrix} \cdot \gamma^{(K)} \Lambda_0^{(K)} x^K$$

$$= \gamma^{(K+1)} \Lambda_0^{(K+1)} x^K,$$

where the last equality is due to Equation (8) and $\Lambda_0^{(K+1)} = \Lambda_0^{(K)} \gamma^{(K)}$. Part (i) is thus proved.

Part (ii) may be proved using a combination of the Forney formula given by Equation (6) and the result of Part (i) Equation (9), in conjunction with $\Lambda(X^{-1})=0$. Lemma 3 is proven.

$\delta_i$ is set to 1 if i is odd or 0 otherwise. Also, by separating the evaluation of the odd-power terms and the even-power terms of $\Lambda(x)$, the evaluation of the odd-power terms is the value of its derivative, which will be used for error evaluation, due to:

$$\Lambda'(x) = \Lambda_1 + 2\Lambda_2 x + 3\Lambda_3 x^2 + \ldots + t\Lambda_t x^{t-1}$$

$$= \Lambda_1 + \Lambda_3 x^2 + \Lambda_5 x^4 + \ldots + \Lambda_{t+\delta_t-1} x^{t+\delta_t-2}.$$

Thus, the computation of error magnitudes can be simplified further to be $$Y_i = \frac{\gamma \Lambda_0 X_i^{-(2t)}}{B(X_i^{-1})\Lambda_{odd}(X_i^{-1})}, \quad i=1,2,\ldots,e, \quad (11)$$

where $\Lambda_{odd}(X_i^{-1})$ can be obtained during the Chien search.

Example pseudo code for a Parallel Chien Search and Error Evaluation (PCSEE) follows. For example, the pseudo code may be used to implement error locator 106 and error evaluator 108.

Input: $\Lambda=[\Lambda_0, \Lambda_1, \Lambda_2, \ldots, \Lambda_t], \gamma, L$
  $B=[B_0, B_1, B_2, \ldots, B_{2t-1}]$
Initialization: $X=Z=1, \lambda_i=\Lambda_i, i=0,1,2,\ldots,t$
  $b_i=B_i, i=0,1,2,\ldots,2t-1$
For $j=0,1,2,\ldots,n$, do:
  Compute $\Lambda_{odd}=\lambda_1+\lambda_3+\lambda_5+\ldots+\lambda_{t+\delta_t-1}$
  Set $\lambda_i \leftarrow \lambda_i \cdot \alpha^{-i+1}, i=1,3,\ldots,t+\delta_t-1$
  Compute $\Lambda_{even}=\lambda_0+\lambda_2+\lambda_4+\ldots+\lambda_{t-\delta_t}$
  Set $\lambda_i \leftarrow \lambda_i \cdot \alpha^{-i}, i=2,4,\ldots,t-\delta_t$
  Compute $B=b_0+b_1+b_2+\ldots+b_{2t-1}$
  Set $b_i \leftarrow b_i \cdot \alpha^{-i}, i=1,2,\ldots,2t-1$
  If $\Lambda_{even}=\Lambda_{odd}$, then compute $Y=(B\Lambda_{odd})^{-1}\gamma\Lambda_0 Z$ and store j,Y
  Set $Z \leftarrow Z \cdot \alpha^{-2t}$
endfor
Output: $[j_1, j_2, \ldots, j_L], [Y_1, Y_2, \ldots, Y_L]$ The example IBMM may be coupled to the example PCSEE since the outputs of the IBMM match the inputs of the PCSEE. Syndromes may be input to the coupled IBMM and PCSEE and the error locations may be output.

In some embodiments, the Berlekamp-Massey method may use a dynamic stopping rule. Using a dynamic stopping rule, the iterative Berlekamp-Massey method may terminate in less than 2t clock cycles compared to the example Berlekamp-Massey pseudo code that uses 2t iterations.

When the number of errors e is less than t, the degree of $\Lambda(x)$, L=e. Then, Lemma 1 implies that the degree of B(x) is 2t-e>t. It is shown in the following lemma that in such cases it is possible to terminate the Berlekamp-Massey iteration earlier while limiting the degree of B(x) to t-1 without performance degradation.

Lemma 4: Given the number of errors $e \leq t$,
(i). $B^{(t+e-1)}(x)$ has degree t-1, and the error locations $X_i^{-1}$, i=1,2,...,e, are the all roots of $\Lambda^{(t+e)}(x)$.
(ii). The error magnitudes are determined by:

$$Y_i = \frac{\gamma^{(t+e-1)} \Lambda_0^{(t+e)} \cdot X_i^{-t-e+2}}{B^{(t+e-1)}(X_i^{-1}) \cdot [\Lambda^{(t+e)}]'(X_i^{-1})}, \quad i=1,2,\ldots,e. \quad (12)$$

The conclusions hold for e=t. Proofs are shown for the case e<t.

Proof of (i): After 2e iterations, the degree of $\Lambda^{(2e)}(x)$ is e and $\Lambda^{(2e)}(x)$ contains all error locations. Lemma 1 indicates that the degree of $B^{(2e)}(x)$ is e as well. From the $(2e+1)^{th}$ iteration to the $(2t)^{th}$, the discrepancy values are zero and $\Lambda^{(r)}(x)$, for r=2e+1,2e+2,...,2t, are unchanged ignoring a scalar factor. Therefore, at the t+e-1$^{th}$ iteration, the degree of $B^{(t+e-1)}(x)$ is t+e-1-deg($\Lambda^{(t+e-1)}$)=t-1. On the other hand, $\Lambda^{(t+e)}(x)$ differs from $\Lambda^{(2e)}(x)$ by a scalar factor and thus contains the all error locations.

The proof of (ii) follows from Lemma 3 (i). Lemma 4 is proved.

In view of the above Lemmas 2 (iii) and 4, one embodiment of a revised inversionless Berlekamp-Massey method results.

A pseudo code embodiment of a Revised Inversionless Berlekamp-Massey Method (rIBMM) follows.

Input: $S=[S_0, S_1, S_2, \ldots, S_{2t-1}]$
Initialization: $\Lambda^{(0)}(x)=1, B^{(0)}(x)=1, \gamma^{(0)}=1, z=\alpha,$ and $L=0$
For $r=0,1,2,\ldots,2t-1$, do:
  Set $z \leftarrow z \cdot \alpha^{-1}$ Compute $\Delta^{(r)} = \Sigma_{i=0}^{L} \Lambda_i^{(r)} \cdot S_{r-i}$
Compute $\Lambda^{(r+1)}(x) = \gamma^{(r)} \cdot \Lambda^{(r)}(x) - \Delta^{(r)} \cdot xB^{(r)}(x)$
$\Delta^{(r)} \neq 0$ and $2L \leq r$, then
    Set $B^{(r+1)}(x) \leftarrow \Lambda^{(r)}(x)$ and $L \leftarrow r+1-L$
    Set $\gamma^{(r+1)} \leftarrow \Delta^{(r)}$
Else
    If $r-L=t-1$ then terminate
    Else set $B^{(r+1)}(x) \leftarrow xB^{(r)}(x)$, $\gamma^{(r+1)} \leftarrow \gamma^{(r)}$
    endif
endfor
Output: $\Lambda = [\Lambda_0^{(r+1)}, \Lambda_1^{(r+1)}, \Lambda_2^{(r+1)}, \ldots, \Lambda_t^{(r+1)}]$, $\gamma = \gamma^{(r)}$, L
$B = [B_0^{(r)}, B_1^{(r)}, B_2^{(r)}, \ldots, B_{t-1}^{(r)}]$, z The described rIBMM embodiment may enable power to be saved dynamically. Note that there is a dynamic stopping rule to terminate when the condition $r-L=t-1$ is satisfied. In some cases, when the average number of errors is much less than t, the power consumption may be reduced to almost half. Correspondingly, the number of iterations used for the rIBMM embodiment may be less than the example IBMM. The loop of the example IBMM uses 2t iterations, whereas the loop of the rIBMM embodiment may use less than 2t iterations.

Figure 2:
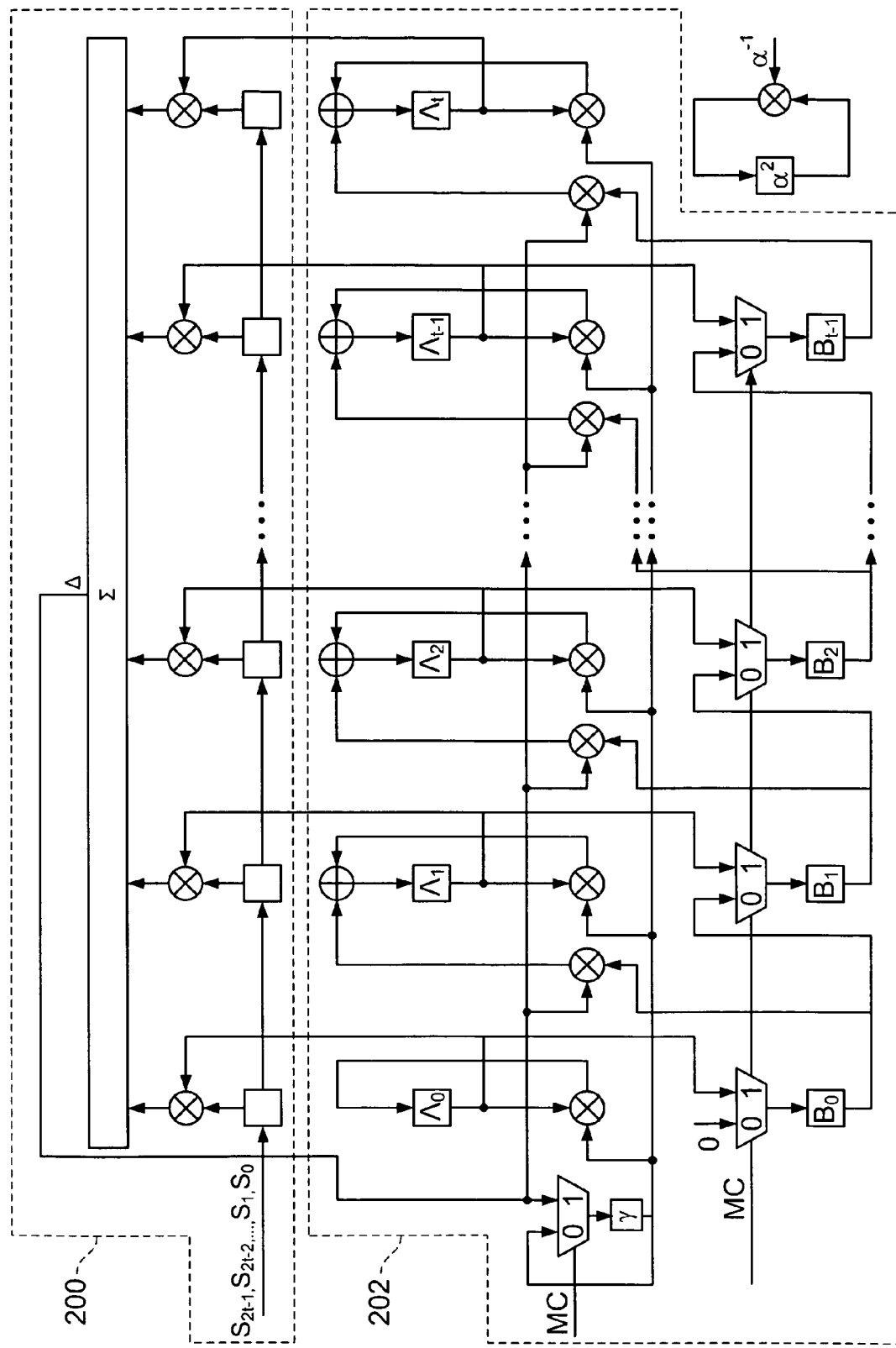
FIG. 2 is a diagram illustrating an embodiment of an rIBMM system.

FIG. 2 is a diagram illustrating an embodiment of an rIBMM system. In the example illustrated, the system may perform the process described by the pseudo code embodiment of the rIBMM system. As shown in the pseudo code, syndromes are input and $\Lambda$, $\gamma$, L, B, and z are output. The discrepancy computation block 200 uses t+1 multipliers, t adders, and 2t registers, ignoring miscellaneous other circuitry in the control (such as counters, arithmetic adder or ring counter, OR gates, latches, etc.). Its critical path has 1 multiplier and $\lceil \log_2(t+1) \rceil$ adders, if t additions are computed via a binary tree structure.

Error locator update block 202 uses 2t+1 multipliers t+1 adders, 2t+1 latches (t+1 latches for $\Lambda(x)$ and t latches for $B(x)$), and t multiplexers. 2t+1 multipliers are used since the update of $\Lambda_0$ uses one multiplier while the update of each of the remaining t terms $\Lambda_1, \Lambda_2, \ldots, \Lambda_t$, uses two multipliers. The critical path of the error locator update block contains one multiplier and one adder. The separate loop logic of z is used in error evaluation. Control signal MC stands for the Boolean operation "$\Delta^{(r)} \neq 0$ and $2r \leq L$", corresponding to the $B_i$ values, may be referred to as the scratch polynomial.

The rIBBM system illustrated contains 3t+2 multipliers, 2t+1 adders, 2t+1 latches, and t multiplexers. The critical path delay of the rIBMM system is determined by $$T_{crit\text{-}path} = 2T_{multi} + (1 + \lceil \log_2(t+1) \rceil) \cdot T_{add}. \quad (13)$$

In some embodiments, a revised parallel Chien search and error evaluation is used with the described rIBMM. For example, the outputs of a rIBMM system may be passed to a revised parallel Chien search and error evaluation system. The illustrated rIBMM may be used for error polynomial generator 104 and the revised parallel Chien search and error evaluation are used for error locator 106 and error evaluator 108.

A pseudo code embodiment of a Revised Parallel Chien Search and Error Evaluation (rPCSEE) follows.

Input: $\Lambda = [\Lambda_0, \Lambda_1, \Lambda_2, \ldots, \Lambda_t]$, $\gamma$, L
$B = [B_0, B_1, B_2, \ldots, B_{t-1}]$, z
Initialization: $Z = \gamma$, $\lambda_i = \Lambda_i$, $i=0, 1, 2, \ldots, t$
    $b_i = B_i$, $i=0, 1, 2, \ldots, t-1$
For $j=0, 1, 2, \ldots, n$, do:
    if $j=0$ then $Z \leftarrow Z \cdot \Lambda_0$, else set $Z \leftarrow Z \cdot z$
    Compute $\Lambda_{odd} = \lambda_1 + \lambda_3 \lambda_5 + \ldots + \lambda_{i+\delta_t-1}$
    Set $\lambda_i \leftarrow \lambda_i \cdot \alpha^{-i+1}$, $i=1, 3, 5, \ldots, t+\delta_t-1$
    Compute $\Lambda_{even} = \lambda_0 + \lambda_2 + \lambda_4 + \ldots + \lambda_{t-\delta_t}$
    Set $\lambda_i \leftarrow \lambda_i \cdot \alpha^{-i}$, $i=2, 4, \ldots, t-\delta_t$
    Compute $B = b_0 + b_1 + b_2 + \ldots + b_{t-1}$
    Set $b_i \leftarrow b_i \cdot \alpha^{-i}$, $i=1, 2, \ldots, t-1$
    If $\Lambda_{odd} = \Lambda_{even}$, then compute $Y = (B\Lambda_{odd})^{-1}Z$ and store j,Y
endfor
Output: $[j_1, j_2, \ldots, j_L]$, $[Y_1, Y_2, \ldots, Y_L]$ As illustrated in the pseudo codes for the PCSEE and rPCSEE, B(x) has a maximum degree of 2t−1 in the former case, compared to t−1 in the latter, which may result in reduced hardware. In some cases, reduced hardware may correspond to reduced manufacturing expenses or reduced power consumption.

Figure 3:
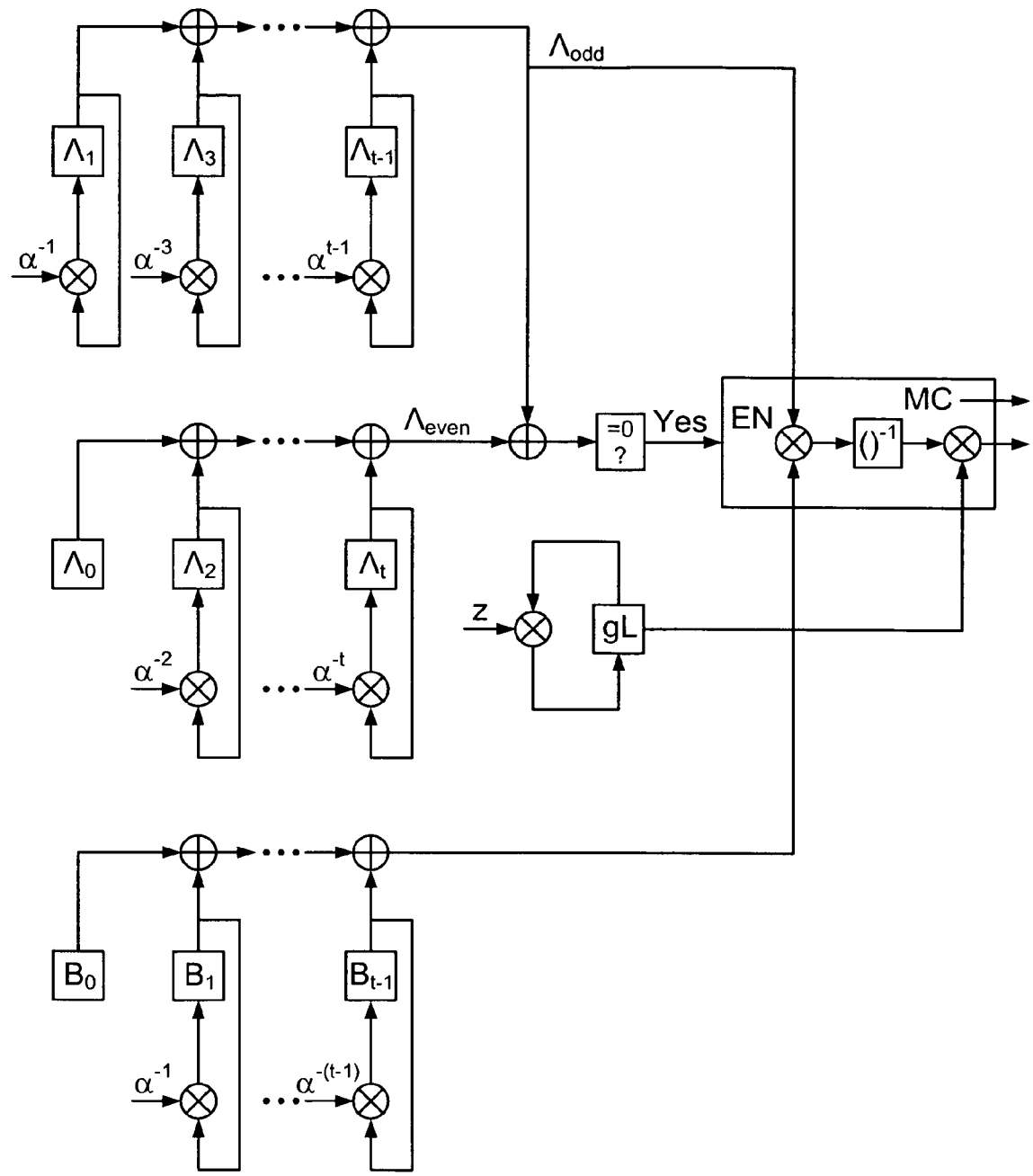
FIG. 3 is a system illustrating an embodiment of an rPC-SEE system.

FIG. 3 is a system illustrating an embodiment of an rPCSEE system. In the example shown, t is an even number. "MC" is denoted by clock cycles, which indicate the index of a root (i.e., an error location). The evaluation of $\Lambda'(x)$, $\Lambda(x)$, B(x) in the illustrated figure use half-multipliers (i.e., one input end of the multiplier is fixed) whose complexity may be roughly one third that of a full-multiplier. By setting $\gamma$ to the initial value of the loop logic and multiplying $\Lambda_0$ in the first iteration (which is otherwise a null operation), the computation of $\gamma \Lambda_0 z^i$ is effectively achieved with one full-multiplier and one multiplexer, whereas other implementations may use three full-multipliers. In total, the rPCSEE system uses 2t−1 half-multipliers, 3 full-multipliers, 1 inverter, 2t−2 adders, and 2t+3 latches/registers. The error evaluator polynomial $\Omega(x)$ has the same degree bound as B(x). In some embodiments, the hardware, complexity of the illustrated rPCSEE system is comparable to the PCSEE system that uses the Forney formula (with inputs $\Lambda(x)$ and $\Omega(x)$), which uses one less full-multiplier, one less half-multiplier, and one less multiplexer.

In some applications, the latency from the cascade of the discrepancy computation block and error locator update block of rIBMM systems may be undesirable. When latency is not a concern, rIBMM embodiments may be desirable since they have lower hardware complexity compared to some other decoder systems. Some types of Berlekamp-Massey methods exist in which the discrepancy computation block and error locator update block are implemented in parallel so that low latency is achieved. Parallel inversionless Berlekamp-Massey methods that use improved methods may be preferred in some applications where latency is a concern.

Parallel Berlekamp-Massey methods perform discrepancy computation and polynomial updates simultaneously to reduce latency. In the Berlekamp-Massey method described in the IBMM example, the discrepancy value $\Delta^{(r)}$ is computed based on the error locator polynomial $\Lambda^{(r)}(x)$, which contributes to the high latency. In some types of parallel Berlekamp-Massey methods, discrepancies are generated iteratively so that they are processed in parallel to the update of the error locator polynomial.

A left-shift operator "L" of a polynomial is defined such that $$[\mathcal{L}_r A](x) \triangleq [A(x) - (A(x) \bmod x^r)]/x^r \quad (14)$$

An alternative interpretation gives more insight. Let $A = [A_0, A_1, A_2, \ldots, A_l]$ be the vector representation of the polynomial $A(x)$, then $\mathcal{L}_r A = [A_r, A_{r+1}, \ldots, A_l]$.

The following block of example pseudo code iteratively generates the discrepancy values.

A pseudo code example of an Iterative Approach to Generate Discrepancy Values follows.

Input: $S = [S_0, S_1, S_2, \ldots, S_{2t-1}]$
Initialization: $\hat{\Omega}^{(0)}(x) = S(x)$, $\hat{\Theta}^{(0)}(x) = S(x)$, $\gamma^{(0)} = 1$, $L = 0$ For r=0, 1, 2, ..., 2t−1, do:
$$\hat{\Omega}^{(r+1)}(x)=\gamma^{(r)}\cdot[\mathscr{L}\hat{\Omega}^{(r)}](x)-\hat{\Omega}_0^{(r)}\cdot\hat{\Theta}^{(r)}(x)$$
  If $\hat{\Omega}_0^{(r)}\neq 0$ and $2L\leq r$, then
    Set $\hat{\Omega}^{(r+1)}(x)\leftarrow[\mathscr{L}_1\hat{\Omega}^{(r)}](x)$
    Set $L\leftarrow r+1-L$
    Set $\gamma^{(r+1)}\leftarrow\hat{\Omega}_0^{(r)}$
  Else do NULL:
    Set $\hat{\Theta}^{(r+1)}(x)\leftarrow\hat{\Theta}^{(r)}(x)$
    Set $\gamma^{(r+1)}\leftarrow\gamma^{(r)}$
  endif
endfor
Output: $\Delta=[\hat{\Omega}_0^{(0)},\hat{\Omega}_0^{(1)},\hat{\Omega}_0^{(2)},\ldots,\hat{\Omega}_0^{(2t-1)}]$ $\hat{\Omega}^{(r)}(x)$ and $\hat{\Theta}^{(r)}(x)$ is a left-shifted polynomial of $\Lambda^{(r)}(x)S(x)$ and $B^{(r)}(x)S(x)$ respectively, more specifically, $$\hat{\Omega}^{(r)}(x)=[\mathscr{L}_r(\Lambda^{(r)}S)](x),$$

$$\hat{\Theta}^{(r)}(x)=[\mathscr{L}_r(B^{(r)}S)](x),$$

where $\Lambda^{(r)}(x)$ and $B^{(r)}(x)$ denote the error locator polynomial couple generated during the r-th iteration of the Berlekamp-Massey method.

Modifications may be performed on the example iterative approach to generate discrepancy values, and Lemmas 5 and 6 are presented to characterize the modified iterative approach.

An embodiment of a Modified Iterative Approach to Generate Discrepancy Values follows.

Input: $S=[S_0, S_1, S_2, \ldots, S_{2t-1}]$
Initialization: $\hat{\Theta}^{(0)}(x)=S_0+S_1x+\ldots+S_{2t-2}x^{2t-2}$,
$\hat{\Omega}^{(0)}(x)=S_0+S_1x+\ldots+S_{2t-2}x^{2t-2}+S_{2t-1}x^{2t-1}$,
$\gamma^{(0)}=1, L=0$
For r=0, 1, 2, ..., 2t−1, do:
$$\hat{\Omega}^{(r+1)}(x)=\gamma^{(r)}\cdot[\mathscr{L}\hat{\Omega}^{(r)}](x)-\hat{\Omega}_0^{(r)}\cdot\hat{\Theta}^{(r)}(x)$$
  If $\hat{\Omega}_0^{(r)}\neq 0$ and $2L\leq r$, then
    Set $\hat{\Theta}^{(r+1)}(x)\leftarrow[\mathscr{L}_1\hat{\Omega}^{(r)}](x)$
    Set $L\leftarrow r+1-L$
    Set $\gamma^{(r+1)}\leftarrow\hat{\Omega}_0^{(r)}$
  Else do NULL:
    Set $\hat{\Theta}^{(r+1)}(x)\leftarrow\hat{\Theta}^{(r)}(x)$
    Set $\gamma^{(r+1)}\leftarrow\gamma^{(r)}$
  endif
  Set $\hat{\Theta}_{2t-r-2}^{(r+1)}=0$
endfor
Output: $\Delta=[\hat{\Omega}_0^{(0)},\hat{\Omega}_0^{(1)},\hat{\Omega}_0^{(2)},\ldots,\hat{\Omega}_0^{(2t-1)}]$ Lemma 5

(i). $\{\hat{\Omega}_i^{(r)}\}_{i=0}^{2t-1-r}$ and $\{\hat{\Theta}_i^{(r)}\}_{i=0}^{2t-2-r}$, r=0,1,2,...,2t, are intact.

(ii). The functionality of the above embodiment does not change.

Proof of (i): Part (i) is shown by induction. It is true for r=0. When r=1, by inspection $\{\hat{\Omega}_i^{(1)}\}_{i=0}^{2t-2}$ and $\{\hat{\Theta}_i^{(1)}\}_{i=0}^{2t-3}$, are intact, so the proposition holds for r=1 as well. Suppose it holds for $r\leq K$ and consider the case r=K+1. $\hat{\Omega}^{(K+1)}(x)$ is determined by $$\hat{\Omega}^{(K+1)}(x)=\gamma^{(K)}\cdot[\mathscr{L}_1\hat{\Omega}^{(K)}](x)-\hat{\Omega}_0^{(K)}\cdot\hat{\Theta}^{(K)}(x).$$

Since $\gamma^{(K)}$ is a function of $\hat{\Omega}_0^{(0)},\hat{\Omega}_0^{(1)},\ldots,\hat{\Omega}_0^{(K-1)}$, it is intact. Based on the assumption, $\{\hat{\Omega}_i^{(K+1)}\}_{i=0}^{2t-2-K}$ are intact. On the other hand, $\hat{\Theta}^{(K+1)}(x)$ is either $[\mathscr{L}_1\hat{\Omega}^{(K)}](x)$ or $\hat{\Theta}^{(K)}(x)$, thus, again by the assumption, $\{\hat{\Theta}_i^{(K+1)}\}_{i=0}^{2t-3-K}$ are intact. Since $\hat{\Theta}_{2t-K-2}^{(K+1)}$ is not included in the set $\{\hat{\Theta}_i^{(K+1)}\}_{i=0}^{2t-3-K}$, none of its elements is reset to 0 during the (K+1)-th iteration. That is, the proposition also holds for the case, r=K+1. Part (i) is thus proven.

Part (ii) is a corollary of Part (i). Lemma 5 is therefore proven.

Lemma 6

(i). The nonzero coefficients of $\hat{\Omega}(x)$ and $\hat{\Theta}(x)$ are limited along with 2t iterations to the shape of upper triangular. More specifically, $$\hat{\Omega}_{2t-r-1}^{(r)}=\hat{\Omega}_{2t-r}^{(r)}=\ldots=\hat{\Omega}_{2t-1}^{(r)}=0, \quad (15)$$

$$\hat{\Theta}_{2t-r-2}^{(r)}=\hat{\Theta}_{2t-r-1}^{(r)}=\ldots=\hat{\Theta}_{2t-1}^{(r)}=0 \quad (16)$$

for r=1,2,...,2t.

(ii). When the number of errors e<t, $$\hat{\Omega}^{(r)}(x)=0, \quad (17)$$

for r=2e, 2e+1, ..., 2t.

Proof of (i): Part (i) can be shown by induction.

Proof of (ii): $\Lambda^{(2e)}(x)$ contains the all error locations as its all roots. Consequently, $$[\Lambda^{(2e)},\Lambda^{(2e+1)},\ldots,\Lambda^{(2t-1)}]=[\hat{\Omega}_0^{(2e)},\hat{\Omega}_0^{(2e+1)},\ldots,\hat{\Omega}_0^{(2t)}]=0.$$

$\hat{\Omega}_0^{(2e)}=0$ indicates that $\hat{\Omega}_0^{(2e+1)}=\gamma^{(2e)}\hat{\Omega}_1^{(2e)}$, thus, $\hat{\Omega}_1^{(2e)}=0$, and so forth, consequently $\hat{\Omega}_2^{(2e)}=0$, $\hat{\Omega}_3^{(2e)}=0$, ..., $\hat{\Omega}_{2t-2e-2}^{(2e)}=0$ are obtained. In conjunction with Part (i), $\hat{\Omega}^{(2e)}(x)=0$. Subsequently $\hat{\Omega}^{(2e+1)}(x)=0$ is obtained, due to $\hat{\Omega}^{(2e)}(x)=0$ and $\hat{\Omega}_0^{(2e)}=0$, and so forth for $\hat{\Omega}^{(r)}(x)=0$, r=2e+2, 2e+3, ..., 2t. Part (ii) and Lemma 6 are thus proven.

As described above, to reduce latency the discrepancy values are generated iteratively in parallel to update of the error locator polynomial, B(x). A left-shifted Berlekamp-Massey update of the error locator polynomial given the discrepancy values is presented.

An example of a Left-shifted Inversionless Berlekamp-Massey Method with Known Discrepancies follows.

Input: $\Delta=[\Delta^{(0)},\Delta^{(1)},\Delta^{(2)},\ldots,\Delta^{(2t-1)}]$
Initialization: $\Lambda^{(0)}(x)=B^{(0)}(x)=x^{2t}, \gamma^{(0)}=1, L=0$
For r=0, 1, 2, ..., 2t−1, do:
$$\Lambda^{(r+1)}(x)=\gamma^{(r)}\cdot[\mathscr{L}_1\Lambda^{(r)}](x)-\Delta^{(r)}\cdot B^{(r)}(x)$$
  If $\Delta^{(r)}\neq 0$ and $2L\leq r$, then
    Set $B^{(r+1)}(x)\leftarrow[\mathscr{L}_1\Lambda^{(r)}](x)$
    Set $L\leftarrow r+1-L$
    Set $\gamma^{(r+1)}\leftarrow\Delta^{(r)}$
  Else do NULL:
    Set $B^{(r+1)}(x)\leftarrow B^{(r)}(x)$
    Set $\gamma^{(r+1)}\leftarrow\gamma^{(r)}$
  endif
endfor
Output: $\Lambda=[\Lambda_0^{(2t)},\Lambda_1^{(2t)},\Lambda_2^{(2t)},\ldots,\Lambda_t^{(2t)}], \gamma=\gamma^{(2t)}, L$
$B=[B_0^{(2t)},B_1^{(2t)},B_2^{(2t)},\ldots,B_{2t-1}^{(2t)}]$ By inspection, the above pseudo code for the left-shifted inversionless Berlekamp-Massey method with known discrepancies may be merged with the pseudo code for an iterative approach to generate discrepancy values to generate a single complete method as follows.

A pseudo code embodiment of a Parallel Inversionless Berlekamp-Massey Method (PIBMM) follows.

Figure 4A:
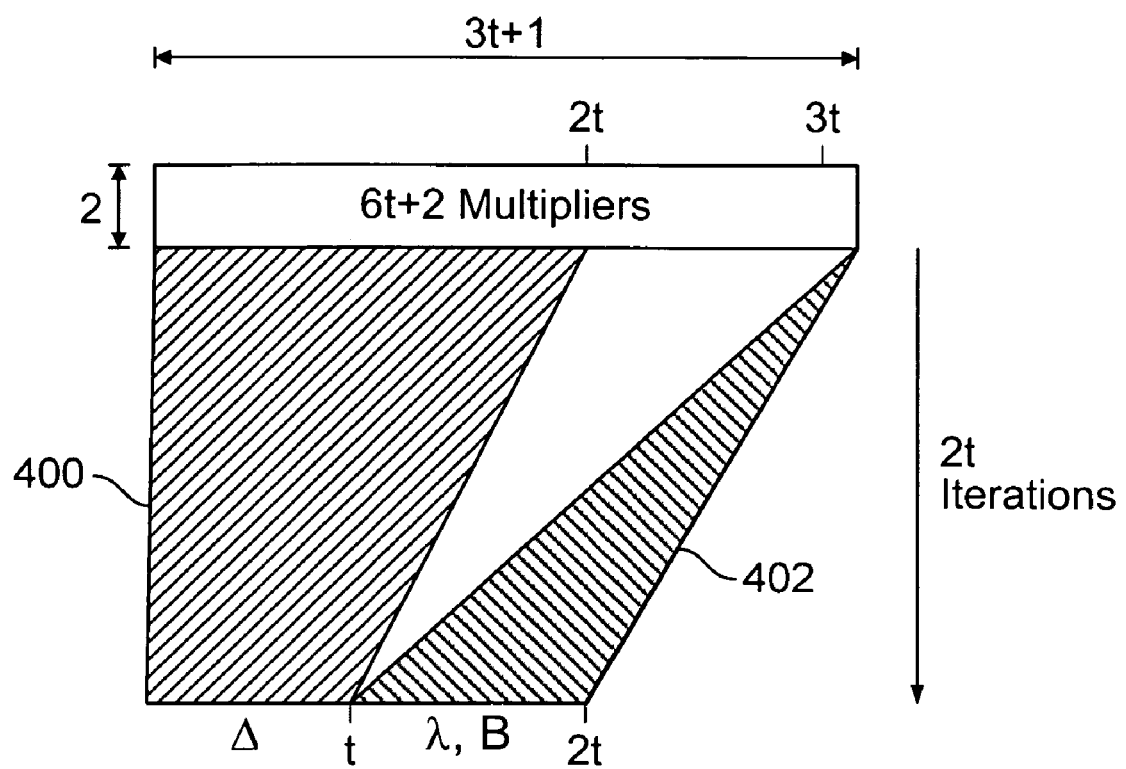
FIG. 4A is a processing diagram illustrating an embodiment of generation of discrepancy values.

Input: $S=[S_0, S_1, S_2, \ldots, S_{2t-1}]$
Initialization: $\hat{\Theta}^{(0)}(x)=S_0+S_1x+\ldots+S_{2t-2}x^{2t-2}+x^{2t}, \gamma^{(0)}=1, L=0$
$\hat{\Omega}^{(0)}(x)=S_0+S_1x+\ldots+S_{2t-2}x^{2t-2}+S_{2t-1}x^{2t-1}+x^{2t}$
For r=0, 1, 2, ..., 2t−1, do:
$$\hat{\Omega}^{(r+1)}(x)=\gamma^{(r)}\cdot[\mathscr{L}_1\hat{\Omega}^{(r)}](x)-\hat{\Omega}_0^{(r)}\cdot\hat{\Theta}^{(r)}(x)$$
  If $\hat{\Omega}_0^{(r)}\neq 0$ and $2L\leq r$, then
    Set $\hat{\Theta}^{(r+1)}(x)\leftarrow[\mathscr{L}\hat{\Omega}^{(r)}](x)$ Set $L \leftarrow r+1-L$
Set $\gamma^{(r+1)} \leftarrow \hat{\Omega}_0^{(r)}$
Else do NULL
Set $\hat{\Theta}^{(r+1)}(x) \leftarrow \hat{\Theta}^{(r)}(x)$
Set $\gamma^{(r+1)} \leftarrow \gamma^{(r)}$
endif
Set $\hat{\Theta}_{2t-r-2}^{(r+1)} = 0$
endfor
Output: $\Lambda = [\hat{\Omega}_0^{(2t)}, \hat{\Omega}_1^{(2t)}, \hat{\Omega}_2^{(2t)}, \ldots, \hat{\Omega}_t^{(2t)}]$, $\gamma = \gamma^{(2t)}$, L
$B = [\hat{\Theta}_0^{(2t)}, \hat{\Theta}_1^{(2t)}, \hat{\Theta}_2^{(2t)}, \ldots, \hat{\Theta}_{2t-1}^{(2t)}]$, z FIG. 4A is a processing diagram illustrating an embodiment of generation of discrepancy values. In the example shown, the x axis illustrates multipliers used, and the y axis illustrates the time domain, 6t+2 multipliers go through 2t iterations. Processing block 400 may be performing an iterative approach to generate discrepancy values. The shaded region of block 400 illustrates the multipliers used in each iteration to generate discrepancies. Syndromes are input to processing block 400 and discrepancy values are output. At the first iteration, processing block 400 uses 4t multipliers. During the iterative process, the number of multipliers used by processing block 400 gradually reduces. At the last iteration, processing block 400 uses 2t multipliers.

Processing block 402 performs the left-shifted inversionless Berlekamp-Massey method with known discrepancies. Discrepancy values are passes to processing block 402 and the error locator polynomial, $\Lambda(x)$, and the scratch polynomial, $B(x)$ are output. The number of multipliers used gradually increases from 0 multipliers at the first iteration to 2t multipliers at the last iteration.

Figure 4B:
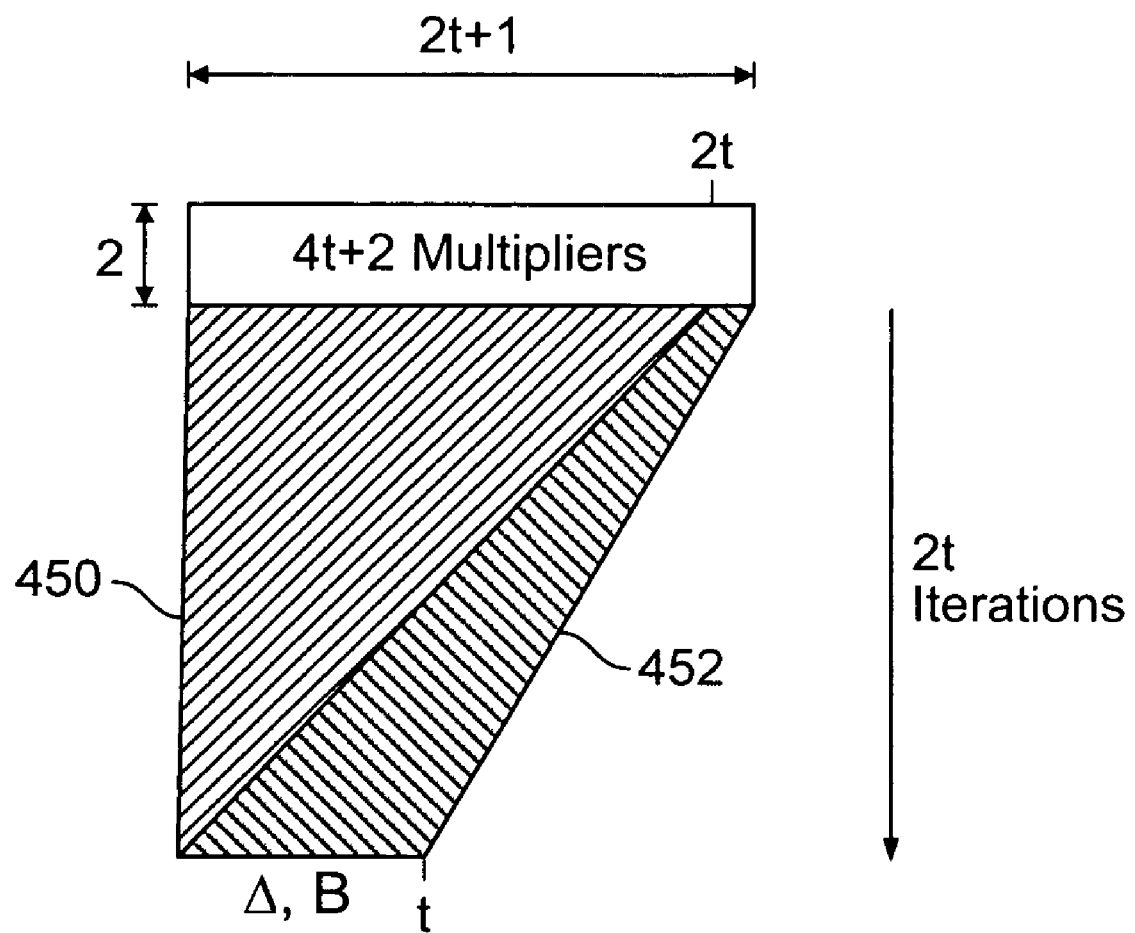
FIG. 4B is a processing diagram illustrating an embodiment of the parallel inversionless Berlekamp-Massey method.

FIG. 4B is a processing diagram illustrating an embodiment of the parallel inversionless Berlekamp-Massey method. In the example shown, 4t+2 multipliers go through 2t iterations. Processing block 450 generates syndromes using a modified iterative approach to generate discrepancy values. Syndromes are input to processing block 450 and syndrome values are output. The number of multipliers used by processing block 450 gradually decreases from 4t multipliers during the first cycle to 0 multipliers during the last cycle.

Processing block 452 generates the error locator polynomial, $\Lambda(x)$, and the scratch polynomial, $B(x)$. The left-shifted inversionless Berlekamp-Massey method with known discrepancies may be used by processing block 452. The number of multipliers used by processing block 452 gradually increases from 2 multipliers to 2t multipliers.

As illustrated, using the parallel inversionless Berlekamp-Massey method may enable less multipliers in a decoders. Rather than instantiating 6t+2 multipliers, 4t+2 multipliers may be instantiated.

In some embodiments, the degree of $B(x)$ is limited to $t-1$. To do so, an auxiliary criterion (set $\hat{\Theta}^{(r+1)}(x) \leftarrow [\mathscr{L}_1 \hat{\Theta}^{(r)}](x)$ when $L_B \geq t-1$) is introduced and a separate loop logic z is utilized to accumulate the unknown $\alpha^{-(t+e-2)}$ used in the error evaluation (refer to Lemma 4). That is, the degree of the scratch polynomial, $B(x)$, is limited to $t-1$ by shifting out zero roots. In addition, condition checking in the control unit can be significantly simplified by tracking the degree of $B(x)$. A revised method with the degree of $B(x)$ limited to $t-1$ is described below.

A pseudo code embodiment of Revised Parallel Inversionless Berlekamp-Massey Method (rPIBMM) follows.

Input: $S = [S_0, S_1, S_2, \ldots, S_{2t-1}]$
Initialization: $\hat{\Theta}^{(0)}(x) = S_0 + S_1 x + \ldots + S_{2t-2} x^{2t-2} + x^{2t}$,
$\gamma^{(0)} = 1$, $L_\Lambda = L_B = 0$ $\hat{\Omega}^{(0)}(x) = S_0 + S_1 x + \ldots + S_{2t-2} x^{2t-2} + S_{2t-1} x^{2t-1} + x^{2t}$, $z = 1$ For $r = 0, 1, 2, \ldots, 2t-1$, do:

$\hat{\Omega}^{(r+1)}(x) = \gamma^{(r)} \cdot [\mathscr{L}_1 \hat{\Omega}^{(r)}](x) - \hat{\Omega}_0^{(r)} \cdot \hat{\Theta}^{(r)}(x)$ If $\hat{\Omega}_0^{(r)} \neq 0$ and $2L \leq r$, then
Set $\hat{\Theta}^{(r+1)}(x) \leftarrow [\mathscr{L}_1 \hat{\Omega}^{(r)}](x)$
Set $L_\Lambda \leftarrow L_B + 1$, $L_b \leftarrow L_\Lambda$
Set $\gamma^{(r+1)} \leftarrow \hat{\Omega}_0^{(r)}$, $z \leftarrow z \cdot \alpha^{-1}$
Else
Set $\gamma^{(r+1)} \leftarrow \gamma^{(r)}$
If $L_B \geq t-1$, then set $\hat{\Theta}^{(r+1)}(x) \leftarrow [\mathscr{L}_1 \hat{\Theta}^{(r)}](x)$
Else set $\hat{\Theta}^{(r+1)}(x) \leftarrow \hat{\Theta}^{(r)}(x)$, $z \leftarrow z \cdot \alpha^{-1}$, $L_B \leftarrow L_B + 1$
endif
Set $\hat{\Theta}_{2t-r-2}^{(r+1)} = 0$
endfor
Output: $\Lambda = [\hat{\Omega}_0^{(2t)}, \hat{\Omega}_1^{(2t)}, \hat{\Omega}_2^{(2t)}, \ldots, \hat{\Omega}_t^{(2t)}]$, $\gamma = \gamma^{(2t)}$, L
$B = [\hat{\Theta}_0^{(2t)}, \hat{\Theta}_1^{(2t)}, \hat{\Theta}_2^{(2t)}, \ldots, \hat{\Theta}_{t-1}^{(2t)}]$, z Lemma 5 ensures the properness of the illustrated PIBMM and rPIBMM embodiments. Moreover, the PIBMM and rPIBMM embodiments may be power efficient, as indicated by Lemma 6. For example, when $e < t$ (where e is the number of erros), after 2e iterations, the update logic $\hat{\Omega}^{(r+1)}(x) = \gamma^{(r)} \cdot [\mathscr{L}_1 \hat{\Omega}^{(r)}](x) - \hat{\Omega}_0^{(r)} \cdot \hat{\Theta}^{(r)}(x)$ where $r \geq 2e$, invokes e+1 multipliers (which are associated with $\Lambda(x)$), while the remaining 4t+1−e multipliers may be disabled. Besides this, the method acts as a shift register array.

In some embodiments, modular architectures that implement components of decoders may be preferred over systems that are not modular. A modular system may instantiate the same block multiple times, whereas a non-modular system may instantiate different modules that perform similar functionality. Modular systems in some applications may be preferred because modular systems may scale easily (for example, expanding or contracting to change t, the error correction capability) or may enable more compact systems (for example, the placement and routing of a reused module may be optimized and reused with each instantiation).

Figure 5A:
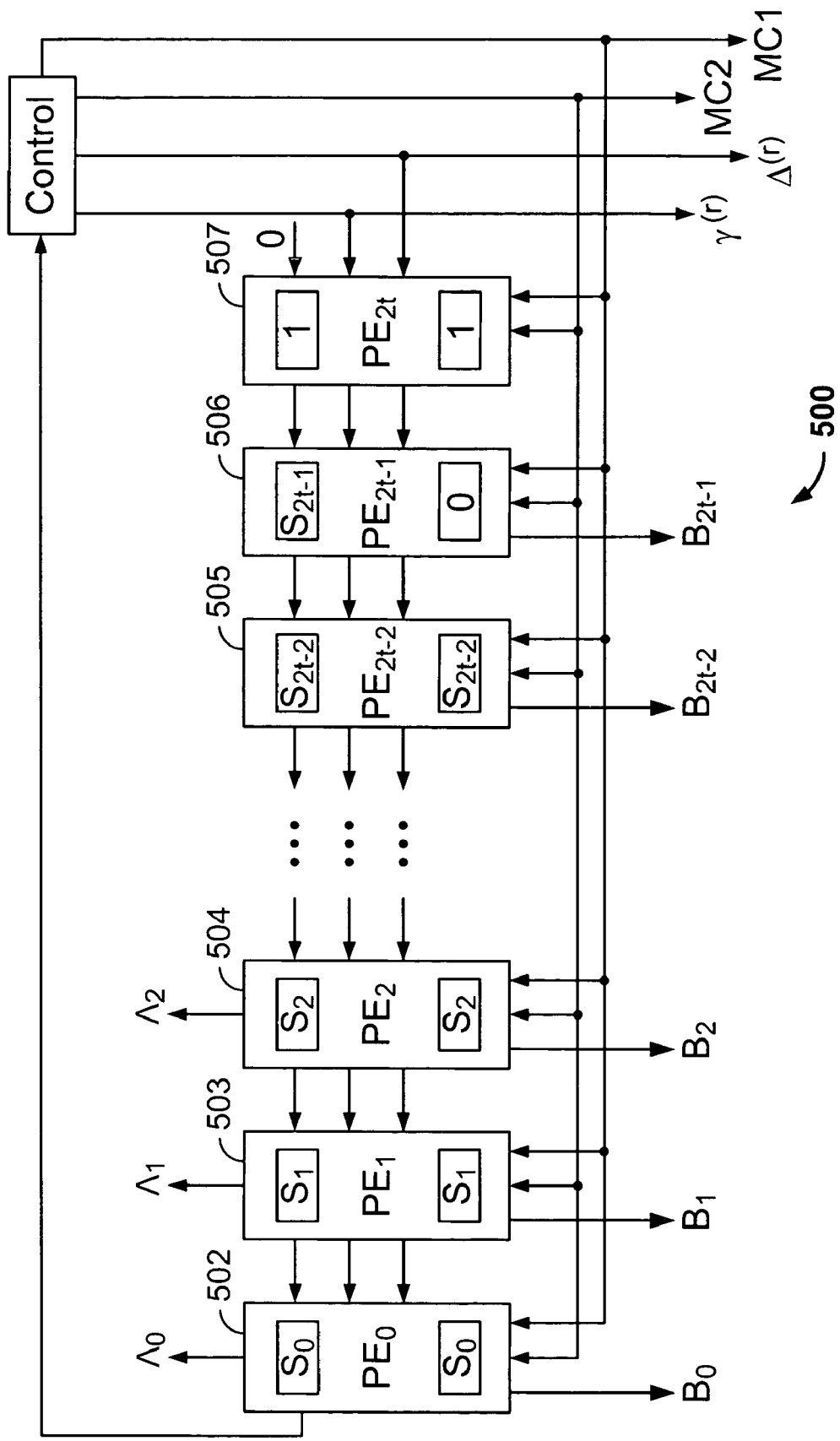
FIG. 5A is a diagram illustrating a modular PIBMM system.

FIG. 5A is a diagram illustrating a modular PIBMM system. In the example shown, the illustrated system may perform the example pseudo code of the parallel inversionless Berlekamp-Massey method. System 500 is modular and devices 502-507 may be different instantiations of the same module. Each of processor elements (PE) 502-507 generates both a value of the error locator polynomial, $\Lambda_i$, and a value of the error update polynomial, $B_i$.

Figure 5B:
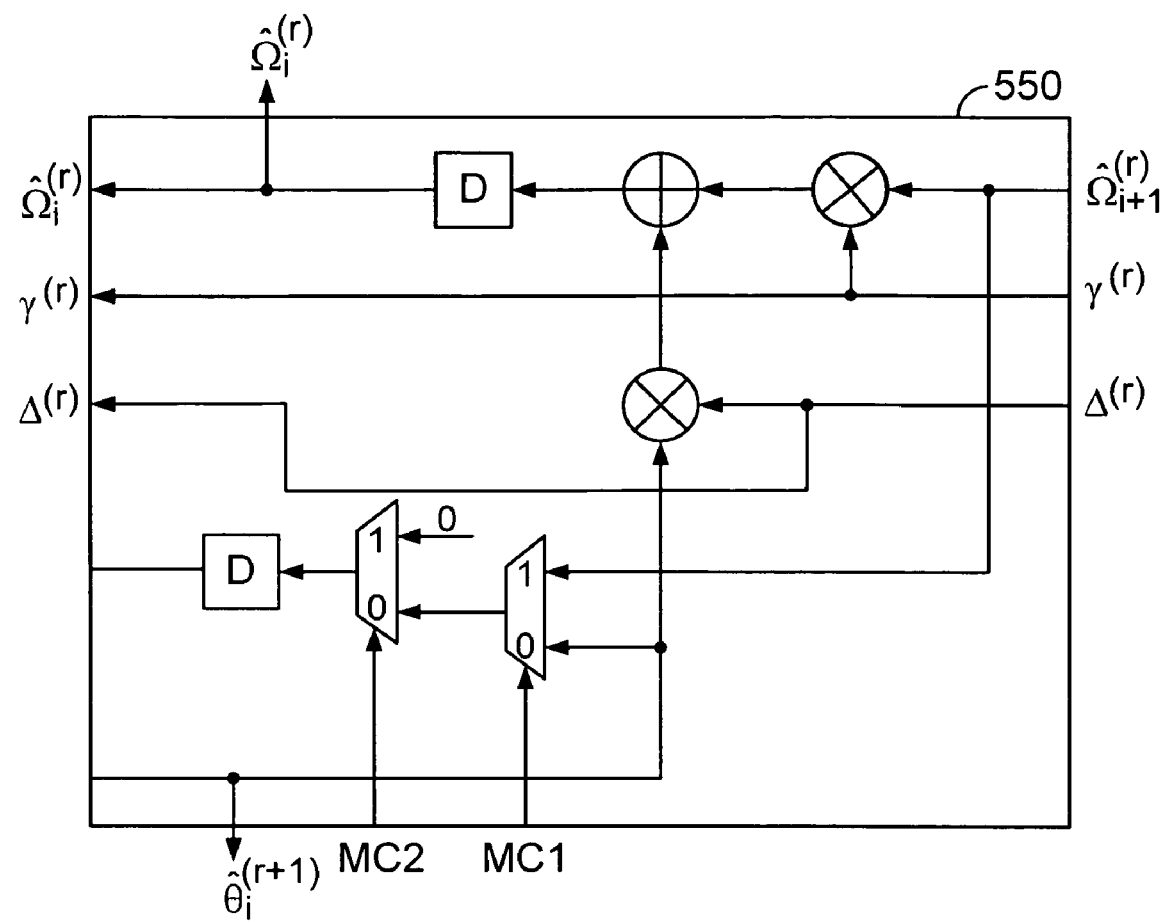
FIG. 5B is a diagram illustrating a processor element (PE) used in a PIBMM system.

FIG. 5B is a diagram illustrating a processor element (PE) used in a PIBMM system. In the example shown, the illustrated PE element may be instantiated in a modular PIBMM system. Orientations of inputs and outputs correspond to orientations of inputs and outputs in FIG. 4A. Outputs $\Lambda_0$ and $B_0$ of PE 502 (and similar outputs for PE 503-507) correspond to outputs $\hat{\Omega}_i^{(r)}$ and $\hat{\Theta}_i^{(r+1)}$, respectively. Other inputs and outputs of PE 450 also match corresponding inputs and outputs of PE 502-507.

Figure 6A:
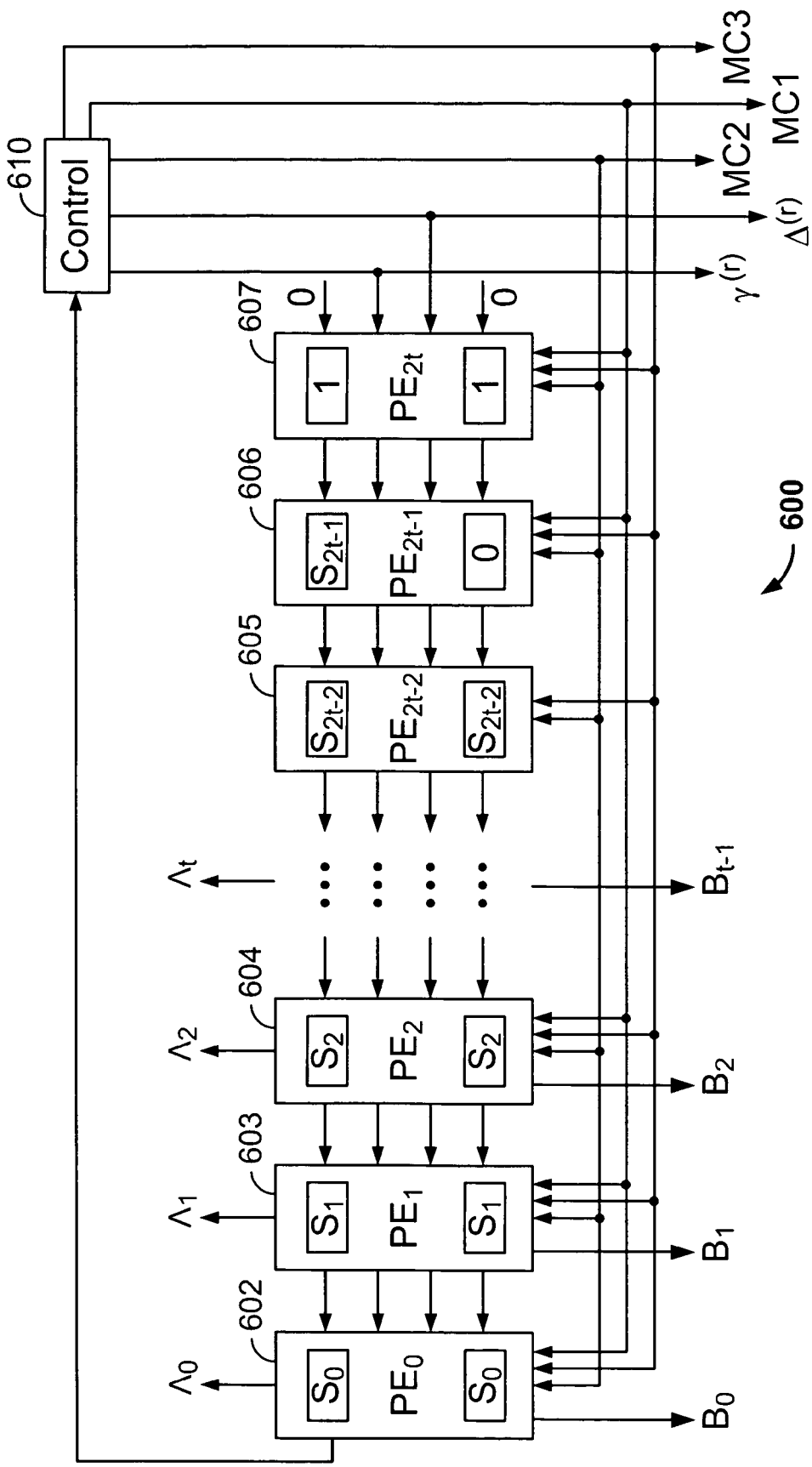
FIG. 6A is a diagram illustrating a modular rPIBMM system.

FIG. 6A is a diagram illustrating a modular rPIBMM system. In the example shown, the illustrated system may perform the example pseudo code of the revised parallel inversionless Berlekamp-Massey method. System 600 is modular and devices 602-607 may be different instantiations of the same module. Note that the control signals of rPIBMM system 600 vary slightly from that of PIBMM system 400. A third control signal MC3 is used by rPIBMM system 600 in addition to MC1 and MC2.

Figure 6B:
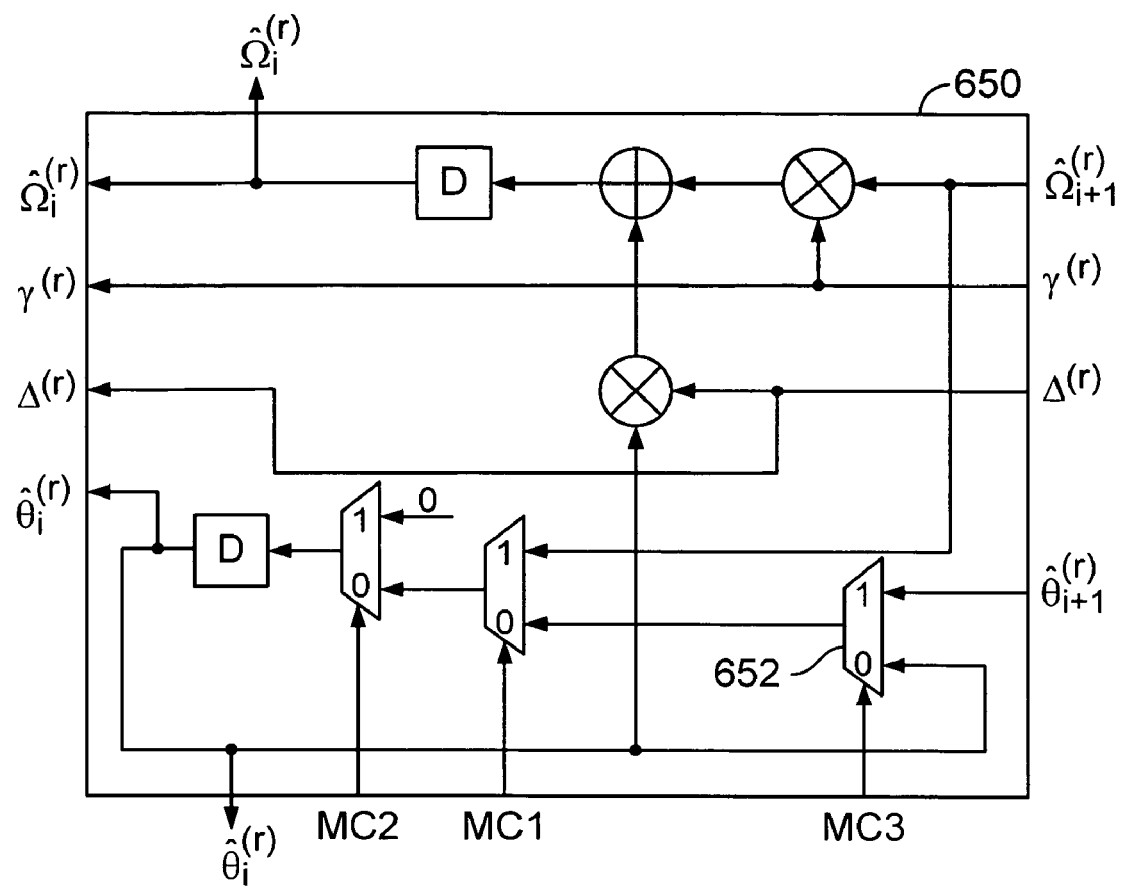
FIG. 6B is a diagram illustrating a processor element (PE) used in an rPIBMM system.

FIG. 6B is a diagram illustrating a processor element (PE) used in an rPIBMM system. In the example shown, the illustrated PE element may be instantiated in a modular rPIBMM system. Orientations of inputs and outputs correspond to orientations of inputs and outputs in FIG. 6A. PE 650 uses a third control signal MC3 to control multiplexer 652. PE 550 does not include MC3 as an input and does not have a multiplexer that corresponds to multiplexer 652.

FIGS. 5A and 6A contain an array of 2t+1 homogeneous processor elements (PE). The control signal MC1 represents the Boolean operation "$\Omega^{(r)} \neq 0$ and $2r \leq L$". There are a variety of ways to implement $\hat{\Theta}_{2t-r-2}^{(r+1)} = 0$, $r = 0, 1, 2, \ldots, 2t-1$. Herein, a 2t-dimension unit vector with the only one initially set to the right-most position is used. In each iteration, the element $\hat{\Theta}_i$ is set to 0 if its index i corresponds to the one in that binary vector and the one is then left-shifted by one bit (its control signal is denoted by MC2).

PE 650 used in the rPIBMM architecture uses one more level of multiplexing than that of PE 550 used in the PIBMM architecture, but is similar otherwise. The control signal MC3 represents the Boolean operation "$r-L < t-1$".

The rPIBMM architecture of system 600 may be coupled to a rPCSEE system. Each PE 650 of the rPIBMM architecture contains two multipliers, one adder, three multiplexes, and two registers. Ignoring control unit 610 (which may be negligible compared to the rest of system 600) the rPIBMM architecture uses 2t+1 adders, 4t+2 multipliers, 4t+2 registers, and 6t+3 multiplexers.

The critical path delay of the illustrated rPIBMM system is caused by one multiplication and one addition in updating $\hat{\Omega}^{(r)}(x)$, i.e., $$T_{crit\text{-}path} = T_{mult} + T_{add}. \quad (18)$$

The multiplex operations are used in updating $\hat{\Theta}^{(r)}(x)$ and thus do not affect the critical path delay. In comparison to the rIBMM architecture, the rPIBMM architecture significantly shortens the critical path delay from $2T_{mult} + (1 + \lceil \log_2(t+1) \rceil) \cdot T_{add}$ to $T_{mult} + T_{add}$, which is used for the error locator update.

FIG. 7 is a table illustrating implementation costs and critical path delays of some embodiments of methods used in Reed Solomon decoding. In the example shown, the illustrated methods solve the key equation in 2t clock cycles (i.e., their outputs may be directly pipelined to the processor of the Chien search and error evaluation). In some applications, if longer delay is allowed, then essentially each PE of a modular architecture may be repeatedly used and hardware complexity may be reduced. For example, the extended Euclidean method (EEM) may be implemented in a folded fashion such that the hardware complexity is reduced to roughly a quarter but the number of clocks is increased by five times. The IBMM is implemented serially so that three multipliers are employed.

The rIBMM and IBMM systems have similar architectures that include a discrepancy computation block and an error locator update block, and the cascade of the two contributes to the critical path delay. The rIBMM uses the least hardware of the architectures illustrated in the table, but has more than twice the critical path delay compared to parallel methods including rPIBMM, PIBMM, and EEM.

The rPIBMM and PIBMM systems have similar architectures, both employing inversionless Berlekamp-Massey iteration. The rPIBMM improves upon the PIBMM by reducing the hardware used while maintaining a critical path delay of $T_{mult} + T_{add}$. The PEs in the two architectures are similar except that the rPIBMM PE has two additional multiplexers. However, the rPIBMM architecture employs t less PEs than the PIBMM system. Some embodiments of the PIBMM may not be scalable, as the beginning position of one of its outputs ($\hat{\Omega}(x)$) is dependent upon t, while the beginning position of the outputs of the rPIBMM embodiment is not dependant upon t. EEM also exhibits regular and scalable architecture. However, the EEM architecture may use twice as much as hardware as an rPIBMM embodiment.

Various embodiments of Reed-Solomon decoder architectures are disclosed. By enforcing a dynamic stopping rule over the conventional inversionless Berlekamp-Massey method, an rIBMM embodiment is obtained. The described rIBMM embodiment uses less hardware compared to some other architectures and may be pipelined to an embodiment of a rPCSEE processor (which is comparable to the PCSEE utilizing the Forney formula), eliminating t cycles of computing the error evaluator polynomial. The rIBMM embodiment may be power efficient by dynamically terminating. In addition, the illustrated rIBMM embodiment incorporates a stopping criteria, e.g., terminates the method after a given number of consecutive zero discrepancies. However, in some applications the latency of the rIBMM embodiment may be undesirable.

In applications where latency is a concern, the example parallel inversionless Berlekamp-Massey method and embodiment of the rPIBMM architecture that achieves the desirable low latency may be preferred over the rIBMM embodiment. The rPIBMM embodiment uses 4t+2 multipliers and registers, which may be less hardware than other low-latency decoder architectures, and may dynamically disable multipliers and adders when they are not used.

Although specific embodiments and examples are presented, the concepts and methods may be applied to other methods and architectures. Additional optimization may also be performed. For example, in some embodiments the rPIBMM architecture is pipelined to reduce the latency further.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method of processing polynomials, including:
   simultaneously performing, by a processor using an iterative process, at least a portion of processing associated with an error evaluator polynomial and at least a portion of processing associated with an error locator polynomial, wherein the error evaluator polynomial and the error locator polynomial are associated with Berlekamp-Massey processing; and
   progressively removing data associated with the error evaluator polynomial, including by:
      removing a piece of data associated with the error evaluator polynomial at each iteration; and
      eliminating the error evaluator polynomial by an end of the simultaneously performed processing, wherein removing and eliminating include setting $\hat{\Omega}^{(r+1)}(x)$ to $\gamma^{(r)} \cdot [\mathscr{L}_1 \hat{\Omega}^{(r)}](x) - \hat{\Omega}_0^{(r)} \cdot \hat{\Theta}^{(r)}(x)$.

2. The method as recited in claim 1, wherein the error evaluator polynomial and the error locator polynomial are associated with Reed-Solomon data.

3. The method as recited in claim 1, wherein the error evaluator polynomial and the error locator polynomial are associated with data obtained from a storage device.

4. The method as recited in claim 1, further including obtaining a syndrome polynomial.

5. The method as recited in claim 1, wherein a location of an error is obtained using the error locator polynomial.

6. The method as recited in claim 1, wherein a location of an error is obtained by obtaining at least one root of the error locator polynomial.

7. The method as recited in claim 1, wherein a location of an error is obtained using a Chien search.

8. The method as recited in claim 1 further including obtaining a degree limited scratch polynomial using the error locator polynomial.

9. The method as recited in claim 1, further including performing at least part of a discrepancy computation and at least part of an error locator update simultaneously.

10. The method as recited in claim 1, further including performing a Chien search, wherein at least part of the Chien search and at least part of determining a magnitude of an error are performed simultaneously.

11. The method as recited in claim 1, wherein progressively removing data includes by left-shifting coefficients associated with the error evaluator polynomial.

12. A system for processing polynomials, including:
a processor configured to:
simultaneously perform, using an iterative process, at least a portion of processing associated with an error evaluator polynomial and at least a portion of processing associated with an error locator polynomial, wherein the error evaluator polynomial and the error locator polynomial are associated with Berlekamp-Massey processing; and
progressively remove data associated with the error evaluator polynomial, including by:
removing a piece of data associated with the error evaluator polynomial at each iteration; and
eliminating the error evaluator polynomial by an end of the simultaneously performed processing, wherein removing and eliminating include setting $\hat{\Omega}^{(r+1)}(x)$ to $\gamma^{(r)} \cdot [\mathscr{L}_1 \hat{\Omega}^{(r)}](x) - \hat{\Omega}_0^{(r)} \cdot \hat{\Theta}^{(r)}(x)$; and
a memory configured to be accessible to the processor.

13. The system as recited in claim 12, wherein the system is smaller than a second system that does not progressively remove data associated with the error evaluator polynomial.

14. The system as recited in claim 12, wherein the processor includes a plurality of devices and each of the plurality of devices is configured to generate a coefficient of the error locator polynomial.

15. The system as recited in claim 12, wherein the processor includes a plurality of devices and each of the plurality of device is configured to generate a coefficient of a scratch polynomial.

16. The system as recited in claim 12, wherein the processor includes a plurality of devices and each of the plurality of devices has the same structure.

17. The system as recited in claim 12, wherein the processor includes a plurality of devices and the number of the plurality of devices varies in accordance with an error correction capability.

18. The system as recited in claim 12, wherein the processor is configured to progressively remove data includes by left-shifting coefficients associated with the error evaluator polynomial.

19. A computer program product for processing polynomials, the computer program product being embodied in a computer readable storage medium and comprising code that, when executed, causes a computer to perform the following:
simultaneously performing, using an iterative process, at least a portion of processing associated with an error evaluator polynomial and at least a portion of processing associated with an error locator polynomial, wherein the error evaluator polynomial and the error locator polynomial are associated with Berlekamp-Massey processing; and
progressively removing data associated with the error evaluator polynomial, including
removing a piece of data associated with the error evaluator polynomial at each iteration; and
eliminating the error evaluator polynomial by an end of the simultaneously performed processing, wherein removing and eliminating include setting $\hat{\Omega}^{(r+1)}(x)$ to $\gamma^{(r)} \cdot [\mathscr{L}_1 \hat{\Omega}^{(r)}](x) - \hat{\Omega}_0^{(r)} \cdot \hat{\Theta}^{(r)}(x)$.

20. The computer program product as recited in claim 19, wherein the computer instructions for progressively removing data include computer instructions for left-shifting coefficients associated with the error evaluator polynomial.

* * * * *